(12) United States Patent
Haratani

(10) Patent No.: US 7,903,453 B2
(45) Date of Patent: Mar. 8, 2011

(54) MAGNETIC MEMORY

(75) Inventor: Susumu Haratani, Tokyo (JP)

(73) Assignee: TDK Corporation, Tokyo (JP)

( * ) Notice: Subject to any disclaimer, the term of this patent is extended or adjusted under 35 U.S.C. 154(b) by 932 days.

(21) Appl. No.: 11/705,720

(22) Filed: Feb. 13, 2007

(65) Prior Publication Data

US 2007/0187786 A1  Aug. 16, 2007

(30) Foreign Application Priority Data

Feb. 13, 2006  (JP) .................................. 2006-034948

(51) Int. Cl.
*G11C 11/00* (2006.01)
(52) U.S. Cl. .......................... 365/158; 365/171; 365/173
(58) Field of Classification Search .................. 365/158, 365/171, 173, 148
See application file for complete search history.

(56) References Cited

U.S. PATENT DOCUMENTS

| 2004/0021189 A1 | 2/2004 | Yoda et al. ................... 257/421 |
| 2006/0098478 A1* | 5/2006 | Ezaki et al. ................... 365/158 |

FOREIGN PATENT DOCUMENTS

| JP | 11-274599 | 10/1999 |
| JP | 2000-090658 | 3/2000 |
| JP | 2004-128430 | 2/2004 |

* cited by examiner

*Primary Examiner* — Huan Hoang
(74) *Attorney, Agent, or Firm* — Porzio, Bromberg & Newman, P.C.

(57) ABSTRACT

A magnetic memory is less susceptible to external magnetic fields and, thus, to writing errors and other adverse effects caused by external magnetic fields. In the magnetic memory, a magnetoresistive element is arranged adjacent to a part of a conductor line. A shield structure is also arranged to shield the magnetoresistive element against external magnetic fields generated by factors other then the part of the line.

14 Claims, 16 Drawing Sheets

(A)

(B)

Sample No1   Iw=12mA

Sample No2   Iw=10mA

Sample No3   Iw=6mA

MAGNETIC MEMORY

BACKGROUND OF THE INVENTION

1. Field of the Invention

The present invention relates to a magnetic memory that has a magnetoresistive element for data storage.

2. Description of the Related Art

Magnetic random access memory (MRAM), a type of memory device used in computers, communication devices and other data-processing devices, has attracted great attention. Unlike volatile memories, such as dynamic random access memory (DRAM) and static random access memory (SRAM), in which stored data is lost once the power is turned off, MRAM magnetically stores data, which is retained in the absence of electricity. MRAM offers a faster access speed, higher reliability and less power consumption than other conventional non-volatile memories, such as flash EEPROM and hard disks. For these reasons, MRAM is considered to replace functions of both volatile memories, such as DRAM and SRAM, and non-volatile memories, such as flash EEPROM and hard disks (see, for example, Japanese Patent No. 3466470).

In developing information devices adapted to ubiquitous computing, which, simply put, is a concept that enables data-processing wherever you are, memories are needed that can handle high-speed processing, has less power consumption, and do not lose the stored data when the power is inadvertently turned off. MRAM has the potential to meet all of these requirements and is thus expected to be used in a variety of information devices.

Potential applications of MRAM include cards and portable digital assistants (PDAs) that are carried around in everyday lives. It is not always easy to have available power sources where these devices are used. Thus, in order for the devices to process large quantities of data in such a harsh environment, the already low power consumption of MRAM needs to be further decreased.

A technology for reducing power consumption of MRAM is utilized in magnetic memories described in Japanese Patent Laid-Open Publications Nos. 2000-90658 and 2004-128430. These magnetic memories have a grid of memory cells, each of which consists of a bit line, a word line arranged perpendicular to the bit line, and a tunneling magnetoresistive (TMR) element arranged between the bit line and the word line at the intersection of the two lines. Each memory cell also includes a yoke (magnetic field control layer) that encircles the TMR element and associated bit and word lines. The yoke is formed of a ferromagnetic material having a high magnetic permeability and serves to reduce leakage of magnetic flux from the bit or word line and to focus magnetic flux onto the TMR element. As a result, magnetic fields required for the reversal of magnetization in TMR elements can be generated at low power consumption and magnetic flux can be focused onto the TMR elements.

A TMR element is configured to include a first magnetic layer (sense layer) in which the direction of magnetization is changed by the external magnetic fields, a second magnetic layer that has a fixed magnetization, and a non-magnetic insulating layer sandwiched between the first and the second magnetic layers. A binary data is stored in the element by magnetizing the first magnetic layer parallel or antiparallel to the magnetization of the second magnetic layer.

To decrease the write current in magnetic memories, it is desirable to minimize the coercivity of the first magnetic layer (sense layer) of TMR elements. However, the magnetization of the first magnetic layer with a decreased coercivity can be reversed by mistake by external magnetic fields or magnetic fields generated by adjacent lines, resulting in an increased likelihood of writing errors.

One approach to avoid such writing errors is to cover the entire magnetic memory package with a magnetic shield to block external magnetic fields. Although such a magnetic shield is effective in blocking magnetic fields acting from outside the package, it cannot prevent interfering magnetic fields generated by adjacent lines within the package. It has thus been difficult to eliminate the effect of write magnetic fields generated by individual TMR elements in highly integrated magnetic memories.

The present invention has been devised in view of the above-described problem of the prior art. It is therefore an object of the present invention to provide a magnetic memory in which individual TMR elements are effectively shielded from external magnetic fields.

SUMMARY OF THE INVENTION

To achieve the above-described object, the magnetic memory of the present invention in one aspect includes a conductor line, a magnetoresistive element arranged adjacent to a part of the line, and a shield structure for shielding the magnetoresistive element against external magnetic field caused by factors other than the part of the line.

Given that $H_c$ is the coercivity of the magnetoresistive element, $H_{ext}$ is the external magnetic field and $|H_{ext}/H_c|$ is the normalized external magnetic field and has a value close to 1, the magnetization of the magnetoresistive element is preferably configured such that it is not reversed by the external magnetic field $H_{ext}$.

Given that $H_c$ is the coercivity of the magnetoresistive element, $H_{ext}$ is the external magnetic field, $|H_{ext}/H_c|$ is the normalized external magnetic field, $I_{sw}[H_0]$ is a current required to flow through the line to write in the magnetoresistive element in the absence of the external magnetic field, $I_{sw}[H_{ext}]$ is a current required to flow through the line to write in the magnetoresistive element in the presence of the external magnetic field, and $|I_{sw}[H_{ext}]/I_{sw}[H_0]|$ is the normalized write current, the rate of change in the normalized write current $|I_{sw}[H_{ext}]/I_{sw}[H_0]|$ is preferably in the range of greater than $-1$ and less than 0 when the normalized external magnetic field $|H_{ext}/H_c|$ is increased.

Preferably, the shield structure is a substantially circular ferromagnetic yoke structure and the magnetoresistive element is arranged adjacent to a part of the ferromagnetic yoke structure.

Preferably, the ferromagnetic yoke structure encircles a part of the line. Preferably, a gap is formed in the ferromagnetic yoke structure along its circumference and the magnetoresistive element is arranged in the gap.

Preferably, the maximum height of the ferromagnetic yoke structure with respect the surface of the magnetoresistive element is small as compared to the maximum length of the magnetoresistive element along the surface of the element. More preferably, the height of the ferromagnetic yoke structure with respect to the surface of the magnetoresistive element is 400 nm or less.

To achieve the above-described object, the magnetic memory of the present invention in another aspect includes a conductor line, a magnetoresistive element arranged adjacent to a part of the line, a first yoke arranged adjacent to the magnetoresistive element, a second yoke arranged at a distance from the surface of the magnetoresistive element, and a yoke joint that joins the first yoke to the second yoke and produces in the first yoke an internal magnetic field opposite to an internal magnetic field of the second yoke.

Preferably, the maximum height of the second yoke with respect the surface of the magnetoresistive element is small as compared to the maximum length of the magnetoresistive element along the surface of the element. Preferably, the second yoke has a greater thickness than the first yoke.

Preferably, a part of the second yoke adjacent to the yoke joint is sloped toward the first yoke.

To achieve the above-described object, the magnetic memory of the present invention in still another aspect includes a conductor line and a magnetoresistive element arranged adjacent to a part of the line. This magnetic memory is characterized in that, given that $H_c$ is the coercivity of the magnetoresistive element, $H_{ext}$ is an external magnetic field generated by factors other than the part of the line, $|H_{ext}/H_c|$ is the normalized external magnetic field, $I_{sw}[H_0]$ is a current required to flow through the line to write in the magnetoresistive element in the absence of the external magnetic field, $I_{sw}[H_{ext}]$ is a current required to flow through the line to write in the magnetoresistive element in the presence of the external magnetic field, and $I_{sw}[H_{ext}]/I_{sw}[H_0]|$ is the normalized write current, the rate of change in the normalized write current $|I_{sw}[H_{ext}]/I_{sw}[H_0]|$ is in the range of greater than −0.5 and less than 0 when the normalized external magnetic field $|H_{ext}/H_c|$ is increased.

Preferably, the magnetic memory further includes a yoke arranged at a distance from the surface of the magnetoresistive element and having a thickness of 50 nm or more.

One significant advantage of the present invention is that writing errors and other effects of external magnetic fields on tunneling magnetoresistive elements can be minimized.

BRIEF DESCRIPTION OF THE DRAWINGS

The above and other objects, features and advantages of the present invention will become apparent from the following description and appended claims, taken in conjunction with the accompanying drawings.

DETAILED DESCRIPTION OF THE PREFERRED EMBODIMENTS

Several embodiments of the magnetic memory of the present invention will now be described with reference to the accompanying drawings, in which like numerals denote like elements so that the same description will not be repeated.

Figure 1:
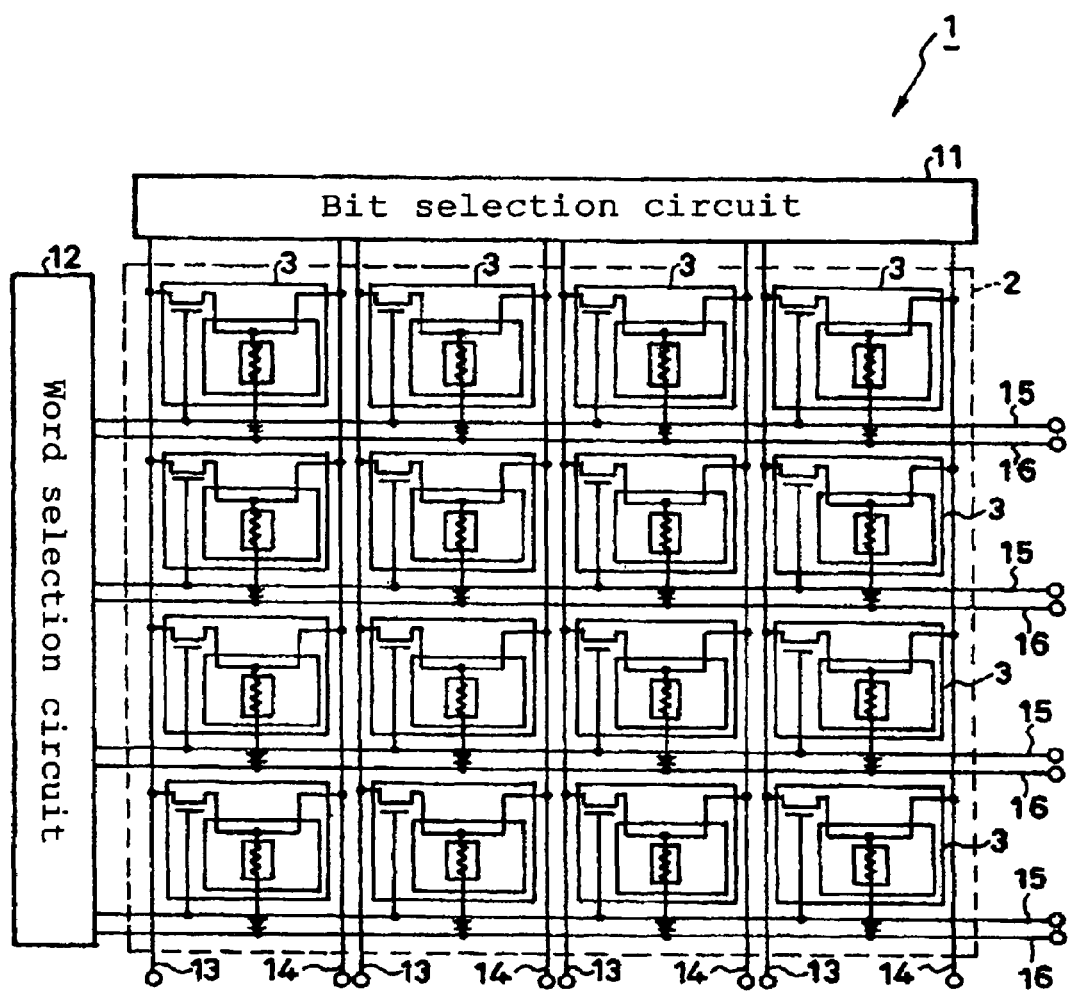
FIG. 1 is a schematic view showing the overall arrangement of a magnetic memory according to a first embodiment of the present invention.
Figure 2:
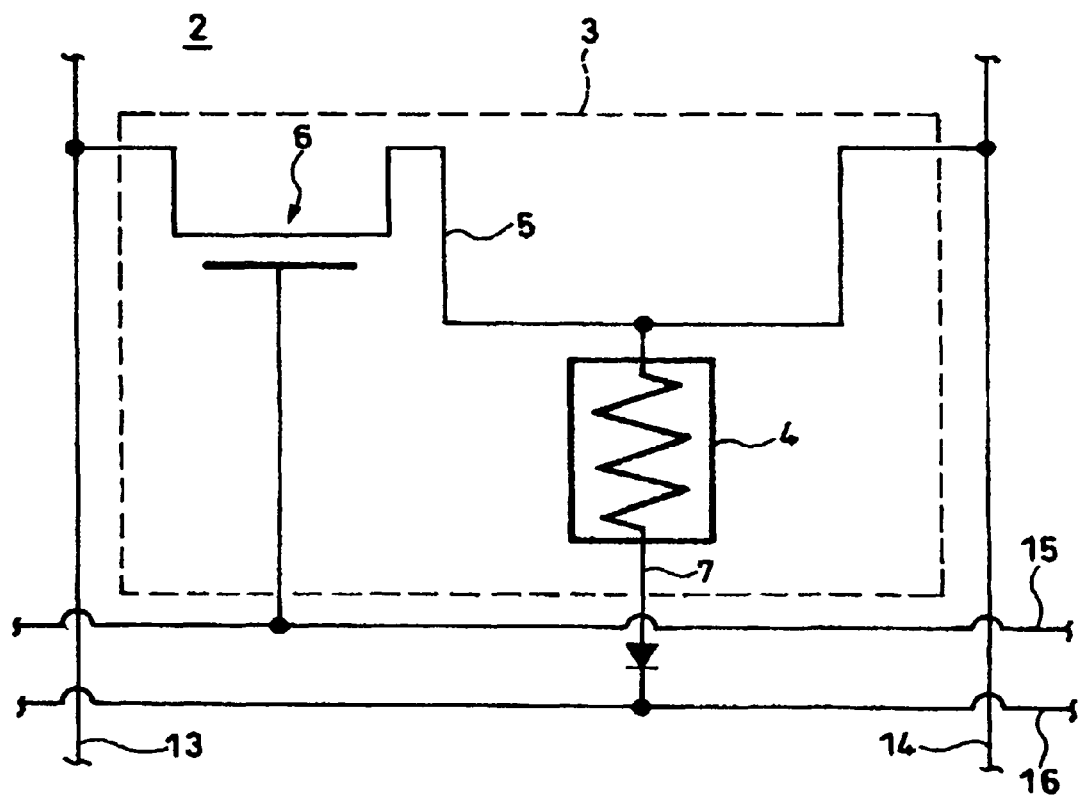
FIG. 2 is a schematic enlarged view of a storage area of the magnetic memory.

With reference to FIG. 1, overall arrangement of an exemplary magnetic memory 1 according to a first embodiment of the present invention is schematically shown. The magnetic memory 1 includes a storage unit 2, a bit selection circuit 11, a word selection circuit 12, bit lines 13, 14 and word lines 15, 16. The storage unit 2 includes an m×n two-dimensional array of storage areas 3 (m and n are each an integer of 2 or larger). As shown in FIG. 2 in an enlarged view, each storage area 3 includes a TMR element 4, a read/write line 5, a read/write transistor 6, a read line 7 and a ferromagnetic yoke structure (not shown). The read/write line 5 of each storage area 3 extends from one of the bit lines 13 so that each storage area 3 forms an independent cell having a single read/write line 5 and a single ferromagnetic yoke structure.

The tunneling magnetoresistive (TMR) element 4 changes its electrical resistance based on its magnetization. Then, a binary data is written in the TMR element 4 as its resistance state. The read/write line 5 is used to generate an external magnetic field to change the magnetization of the TMR element 4.

One end of the read/write line 5 is electrically connected to the bit line 13 via the read/write transistor 6, while the other end of the read/write line 5 is electrically connected to the bit line 14. The read/write transistor 6 serves as a switch to control the write current and the read current that flow through the read/write line 5. The read/write line 5 is connected to one of the drain or the source and the bit line 13 is connected to the other. The word line 15 is connected to the gate. In this manner, a current flows through the read/write line 5 via the read/write transistor 6 to generate a magnetic field around the read/write line 5.

The read line 7 is connected to the TMR element 4 at one end and to the word line 16 at the other end. A diode is arranged on the line. The read/write line 5 is connected to the TMR element 4 on the side opposite to the side connected to the word line 16. Accordingly, a read current is supplied to the TMR element 4. The diode arranged on the read line 7 serves to prevent a sneak current flowing from the word line 16 into the TMR element 4.

A pair of bit lines 13, 14 is arranged for each column in the array of the storage areas 3. Each bit line 13 is connected to the read/write transistor 6 in each of the storage areas 3 in a given column and is connected via each read/write transistor 6 to one end of the read/write line 5. Each bit line 14 is connected to the other end of the read/write line 5 in each of the storage areas 3 in a given column. Therefore, a current flows through the read/write line 5 when a voltage is applied between the bit lines 13 and 14 to turn on the read/write transistor 6.

A pair of word lines 15, 16 is arranged for each row of the storage areas 3. Each word line 15 is connected to the gate of the read/write transistor 6 in each of the storage areas 3 in a given row. Each word line 16 is connected to the TMR element 4 via the read line 7 in each of the storage areas 3 in a given row.

Referring back to FIG. 1, the bit selection circuit 11 serves to supply a positive or negative write current to the read/write line 5 in each storage area 3. Specifically, the bit selection circuit 11 includes an address decoder circuit and a current drive circuit. The address decoder circuit addresses a particular column in the array of the storage areas 3 based on the internally or externally designated address. The current drive circuit applies a positive or negative voltage between the bit lines 13 and 14 in the addressed column, thereby supplying the write current to each of the read/write lines 5 connected between the bit lines 13 and 14.

Similarly, the word selection 12 includes an address decoder circuit and a current drive circuit. The address decoder circuit addresses a particular row in the array of the storage areas 3 based on the internally or externally designated address. The current drive circuit applies a predetermined voltage to the word lines 15, 16 in the addressed row. Therefore, the read/write transistor 6 is turned on when the word selection circuit 12 applies a control voltage to the word line 15 in the addressed row. Such a control makes it possible to determine whether the write current should be provided to the read/write line 5 in the cell addressed by the bit selection circuit 11. The word selection circuit 12 also controls the read current by applying a specific voltage to the word line 16. Specifically, the bit selection circuit 11, by means of the address decoder circuit, addresses a particular column based on the internally or externally designated address and applies a specific voltage to the bit line 13 in the addressed column. At the same time, the word selection circuit 12, by means of the address decoder circuit, addresses a particular row corresponding to the address and applies a specific voltage to the word line 16 in the addressed row. This provides the read current between the bit line 13 and the word line 16. A voltage is also applied to the word line 15 in the addressed row so that the read current can be controlled by the read/write transistor 6.

Figure 3:
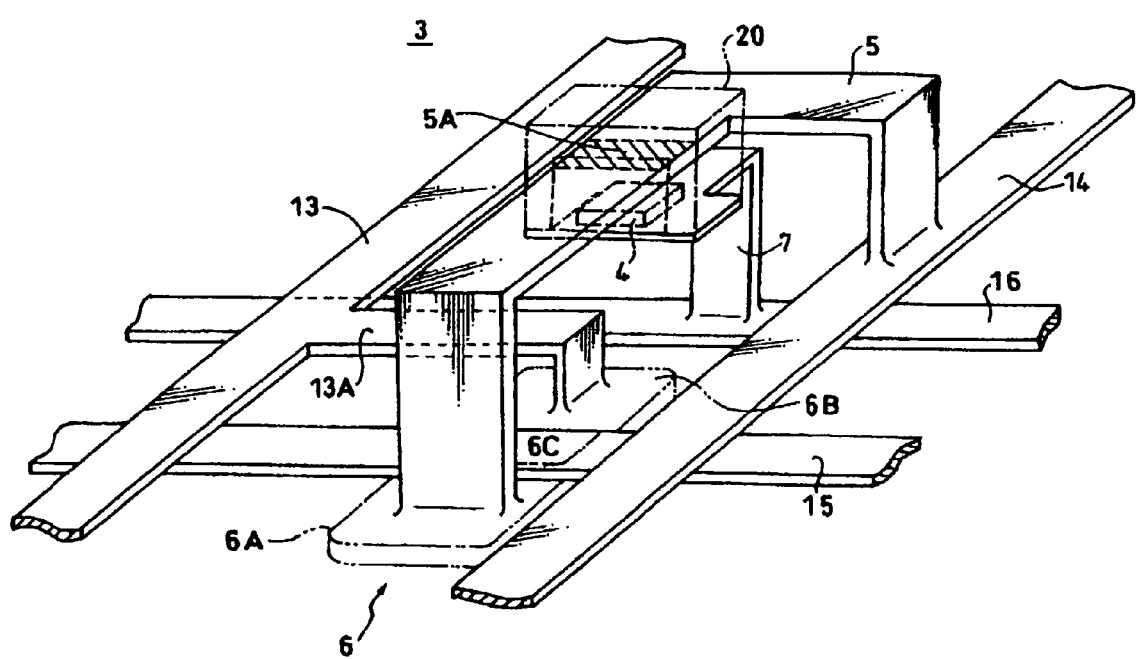
FIG. 3 is an enlarged perspective view showing the three-dimensional internal structure of the storage area.

The specific structure of the storage area 3 of the magnetic memory 1 is now described in detail. With reference to FIG. 3, the wirings of the storage area 3 are depicted in a perspective view. The storage area 3 generally includes a bottom semiconductor layer, an intermediate line layer and an upper magnetic material layer. The semiconductor layer includes a semiconductor substrate (not shown) that ensures the mechanical strength of the entire storage area 3 and serves as a platform for forming the read/write transistor 6 and other semiconductor devices. The uppermost magnetic material layer includes various elements made of magnetic materials, including the TMR element 4 and the ferromagnetic yoke structure 20 for effectively focusing magnetic fields onto the TMR element 4. The intermediate line layer includes the bit lines 13, 14, the word lines 15, 16, a part of the read/write line 5 and the read line 7.

The read/write transistor 6 in the semiconductor layer is surrounded by insulating areas so that the adjacent read/write transistors 6 are electrically isolated from one another. The insulating areas are formed of an insulator such as $SiO_2$. The semiconductor substrate may be an Si substrate doped with p-type or n-type impurities.

Figure 4:
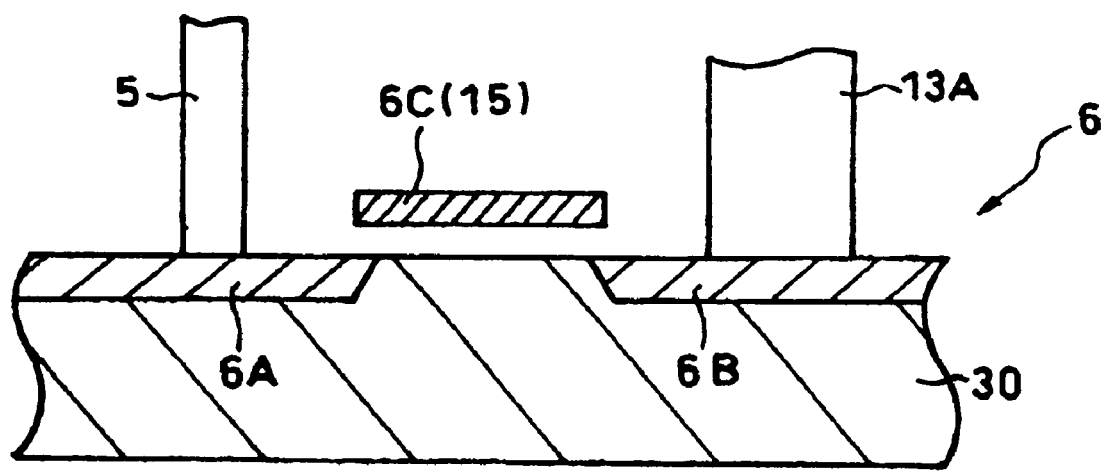
FIG. 4 is an enlarged cross-sectional view showing the structure of a transistor arranged in the storage area.

As shown in FIG. 4 in an enlarged view, the read/write transistor 6, an opposite conductive-type to semiconductor substrate 30, consists of a drain region 6A, a source region 6B and a gate electrode 6C. In other words, the semiconductor substrate 30 fills the space between the drain region 6A and the source region 6B. The gate electrode 6C is arranged above the substrate 30 at a distance from the substrate 30. The gate electrode 6C comprises the word line 15, such that when a voltage is applied to the word line 15, the drain region 6A and the source region 6C of the read/write transistor 6 are electrically connected with each other, allowing the current supplied by the bit line 13 to flow through the read/write line 5.

Referring back to FIG. 3, the entire space of the line layer except lines such as the bit lines 13, 14 and the word lines 15, 16 is filled with an insulator. As with the insulating region of the semiconductor layer, the insulator may be $SiO_2$. The conductor lines may be formed of materials such as W and Al.

The read/write line 5 adjacent to the TMR element 4 has a substantially L-shaped conformation that extends parallel to the plane containing the array of the storage areas 3 (i.e., horizontal direction). One end of the read/write line 5 is bent perpendicular to the array plane to form a vertical line, which is connected to the bit line 14 at the bottom. Likewise, the other end of the read/write line 5 is bent perpendicular to the array plane to form a vertical line, which is ohmically connected at the bottom to the drain region 6A of the read/write transistor 6.

A draw line 13A for each storage area 3 branches from the bit line 13 and extends horizontally. One end of the draw line 13A is bent vertically and ohmically connected to the source region 6B of the read/write transistor 6. The read line 7 also extends horizontally. One end of the read line 7 is electrically connected to the TMR element 4 while the other end is bent vertically and connected at the bottom to the word line 16.

Part of the word line 15 extending in the row direction serves as the gate electrode 6C. This is equivalent to the word line 15 being electrically connected to the gate electrode 6C of the read/write transistor 6.

Figure 5:
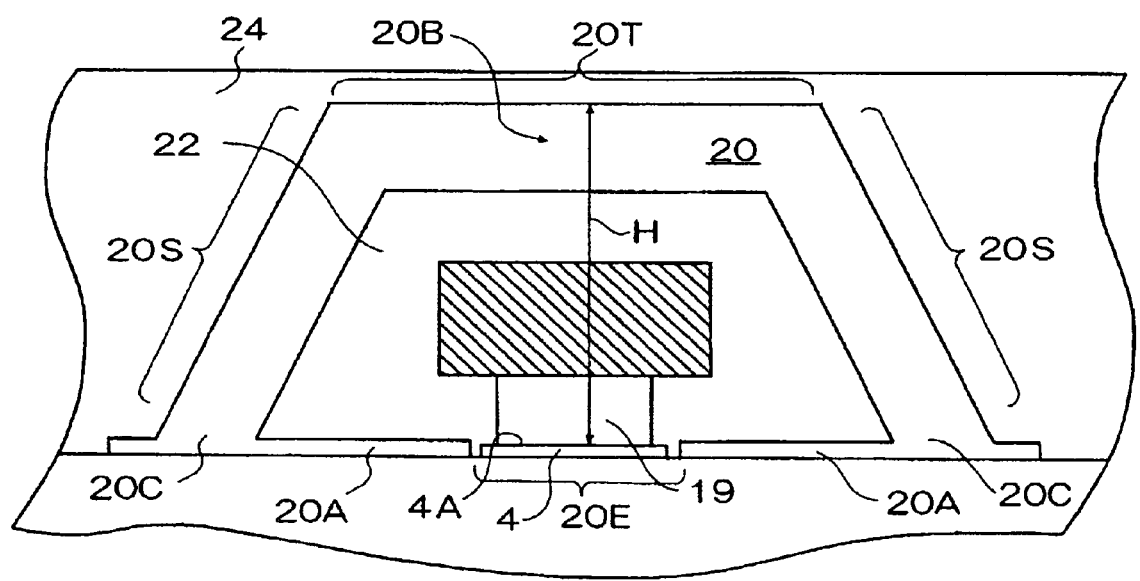
FIG. 5 is an enlarged cross-sectional view showing the structure of a ferromagnetic yoke structure arranged in the storage area.

The magnetic material layer is now described with reference to FIG. 5. The magnetic material layer includes the TMR element 4, the ferromagnetic yoke structure 20, part of the read/write line 5 and part of the read line 7. The entire space of the magnetic material layer except the constructions and conductor lines described below is filled with an insulator 24.

Figure 6:
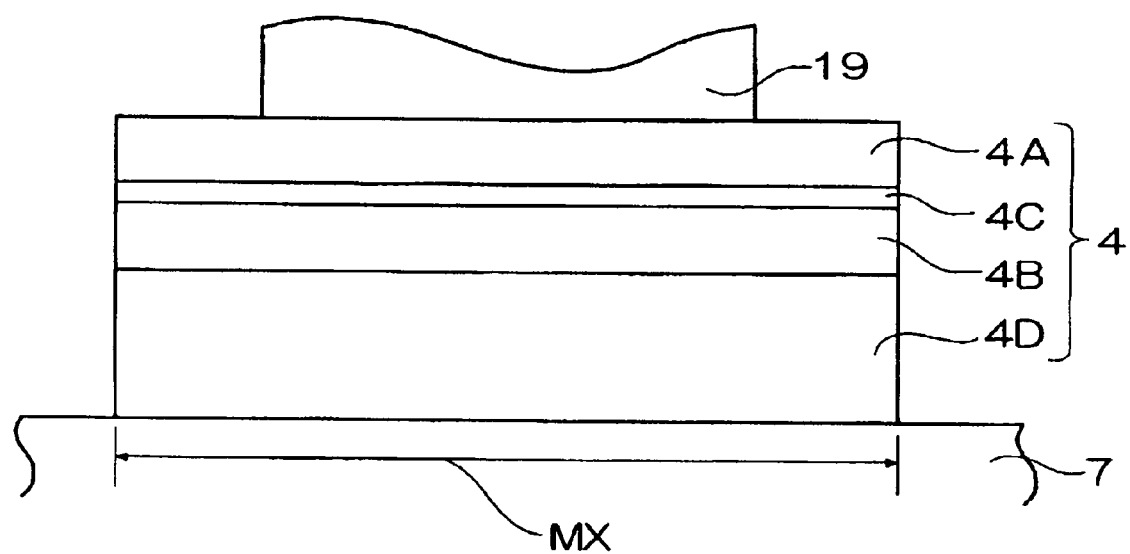
FIG. 6 is an enlarged side view showing the layered structure of a magnetoresistive element arranged in the storage area.

As shown in FIG. 6 in an enlarged view, the TMR element 4 has a first magnetic layer (free layer/sense layer) 4A in which the direction of magnetization is changed by external magnetic fields, a second magnetic layer (pinned layer) 4B that has a fixed magnetization, a non-magnetic insulating layer (insulator layer) 4C sandwiched between the first magnetic layer 4A and the second magnetic layer 4B, and an antiferromagnetic layer 4D that fixes, or pins, the magnetization of the second magnetic layer 4B. When the direction of magnetization of the first magnetic layer 4A is changed by external magnetic fields, the resistance of the TMR element 4 changes. Thus, a binary data can be stored in the TMR element 4 as two different resistances. The first magnetic layer 4A may be formed of ferromagnetic materials such as Co, CoFe, NiFe, NiFeCo and CoPt.

The magnetization of the second magnetic layer 4B is fixed by the antiferromagnetic layer. Specifically, the magnetization of the second magnetic layer 4B is stably oriented in one direction by the exchange coupling at the interface of the antiferromagnetic layer 4D and the second magnetic layer 4B. The second magnetic layer 4B is oriented with respect to the first magnetic layer 4A so that their easy-magnetization axes are parallel to each other. The second magnetic layer 4B may be formed of ferromagnetic materials, such as Co, CoFe, NiFe, NiFeCo and CoPt. The antiferromagnetic layer 4D may be formed of IrMn, PtMn, FeMn, PtPdMn, NiO or any combination thereof.

The non-magnetic insulating layer 4C is formed of a non-magnetic insulator and is disposed between the first magnetic layer 4A and the second magnetic layer 4B so that the tunnel magneto resistance (TMR) effect occurs. Specifically, the resistance of the TMR element 4 changes with the relative orientation (i.e., parallel or antiparallel) of the magnetization of the first magnetic layer 4A and the second magnetic layer 4B. The non-magnetic insulating layer 4C may be formed from oxides or nitrides of metals such as Al, Zn and Mg.

While not shown, a second magnetic layer 4B may be replaced by a three-layered structure (i.e., second magnetic layer/non-magnetic metal layer/third magnetic layer) such that the magnetization of the second magnetic layer 4B is stabilized. The three-layered structure is disposed with the third magnetic layer facing the antiferromagnetic layer 4D. By forming the non-magnetic metal layer with a proper thickness, the third magnetic layer and the second magnetic layer are magnetized antiparallel by the exchange interaction between the third magnetic layer and the second magnetic layer. As a result, the magnetization of the second magnetic layer is stabilized. The third magnetic layer is preferably formed of ferromagnetic materials such as Co, CoFe, NiFe, NiFeCo and CoPt while other materials may be used. These materials may be used either individually or in combination. The non-magnetic metal layer disposed between the second magnetic layer and the third magnetic layer is preferably formed of Ru, Rh, Ir, Cu and Ag.

The first magnetic layer 4A of the TMR element 4 is electrically connected to the read/write line 5 via the metal layer 19. The antiferromagnetic layer 4D of the TMR element 4 is electrically connected to the read line 7. This construction allows the read current to flow from the read/write line 5, through the TMR element 4, to the read line 7. As a result, the changes in the resistance of the TMR element 4 can be detected. The ferromagnetic yoke structure 20 is arranged in such a manner that it encircles a region 5A of the read/write line 5 adjacent to the TMR element 4 (see FIG. 3). The first magnetic layer 4A of the TMR element 4 is oriented so that its easy-magnetization axis is perpendicular to the length of the read/write line 5 (or perpendicular to the write current flow).

Referring back to FIG. 5, the ferromagnetic yoke structure 20 is shown that serves to protect the TMR element 4 from external magnetic fields. It includes a yoke 20A adjacent to the side of the read/write line 5 facing the TMR element 4 and a yoke 20B adjacent to the side of the read/write line 5 opposite to the TMR element 4. The yoke 20A is joined at either end to the yoke 20B via a pair of yoke joints 20C, 20C to form a generally circular construction. When viewed with respect to the TMR element 4, the yoke 20A is arranged close to the TMR element 4 (hence, the close yoke or the first yoke) and the yoke 20B is distant from the TMR element 4 (the distant yoke or the second yoke). Together, the close yoke 20A and the distant yoke 20B form the ferromagnetic yoke structure 20 that encircles the read/write line 5. The distant yoke 20B is configured to include a top portion 20T positioned above the read/write line 5 and a pair of slope portions 20S, 20S arranged at either end of the top portion 20T, or adjacent to the yoke joints 20C, 20C.

The close yoke 20A has a gap 20E formed in the mid-portion thereof. The TMR element 4 is arranged in the gap 20E. When viewed along its axis, the ferromagnetic yoke structure 20 has a substantially C-shaped conformation with an opening (gap 20E) in its circumference.

According to this embodiment, the maximum height H of the distant yoke 20B of the ferromagnetic yoke structure 20 with respect to the surface 4A of the TMR element 4 (the side of the TMR element facing the yoke) is smaller than the maximum length of the TMR element 4 along the surface 4A (the length along the easy-magnetization axis indicated as MX in FIG. 6). For example, when the length MX of the TMR element 4 is 300 nm, the maximum height of the distant yoke 20B is 300 nm or less. Minimizing the distance between the distant yoke 20B and the TMR element 4 can increase the sensitivity of the TMR element 4 to external magnetic fields.

A pair of the slope portions 20S, 20S and a pair of the yoke joints 20C, 20C serve to direct the magnetic field generated in the top portion 20T toward the close yoke 20A (toward the TMR element 4). Accordingly, the internal magnetic field of the top portion 20T is reversed by the slope portions 20S, 20S and the yoke joints 20C, 20C, so that it has the opposite direction in the close yoke 20A. The slope portions 20S, 20S of the distant yoke 20B are each arranged at an angle to the close yoke 20A. Specifically, the angle P that the top portion 20T makes with each of the slope portions 20S, 20S (see FIG. 7) is an obtuse angle, while the angle that the close yoke 20A makes with each of the slope portions 20S, 20S at the yoke joints 20C, 20C is an acute angle. Each slope portion 20S has a greater thickness than the close yoke 20A.

Figure 7:
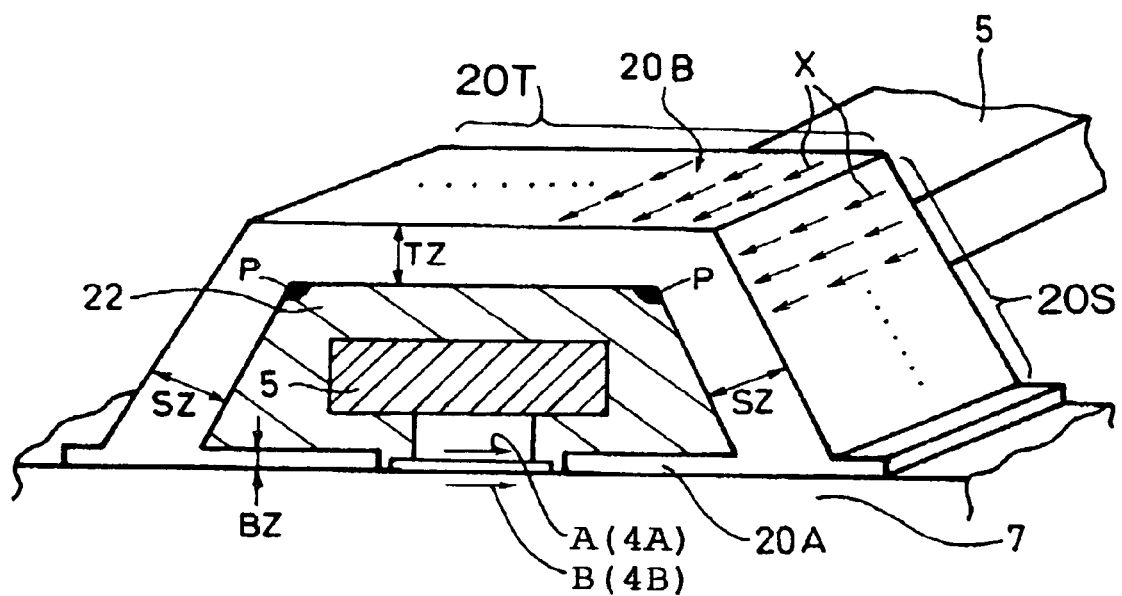
FIG. 7 is a partial cross-sectional perspective view schematically illustrating magnetization of the ferromagnetic yoke structure arranged in the storage area.

As depicted in FIG. 7, the thickness TZ of the top portion 20T of the distant yoke 20B is greater than the thickness BZ of the close yoke 20A. Specifically, the thickness TZ is in the range of 50 nm to 100 nm. The thickness BZ of the thinner close yoke 20A is greater than 10 nm and less than 30 nm. The thickness SZ of the slope portion 20S is greater than 20 nm and less than 100 nm on average.

The TMR element 4 is 4 nm thick and has an external dimension of 300 nm×200 nm along the surface 4A. Thus, the maximum height H of the distant yoke 20B with respect to the surface 4A is preferably less than 300 nm.

The manner in which data is written into the TMR element 4 of the magnetic memory 1 in this embodiment is now described.

As shown in FIG. 7, the read/write line 5 does not produce magnetic fields when no current is flowing through it. Due to its conformation, the magnetization X of the ferromagnetic yoke structure 20 may be aligned in a single magnetic domain directed along the length of the read/write line 5, or it may be directed in random directions in different magnetic domains. As a result, the ferromagnetic yoke structure 20 is kept from becoming a single magnetic domain along the circumference of the read/write line 5. In this figure, the magnetization B of the second magnetic layer 4B and the magnetization A of the first magnetic layer 4A are parallel to each other. In this embodiment, the magnetizations A and B that are parallel to each other represent "0" of a binary date.

Figure 8:
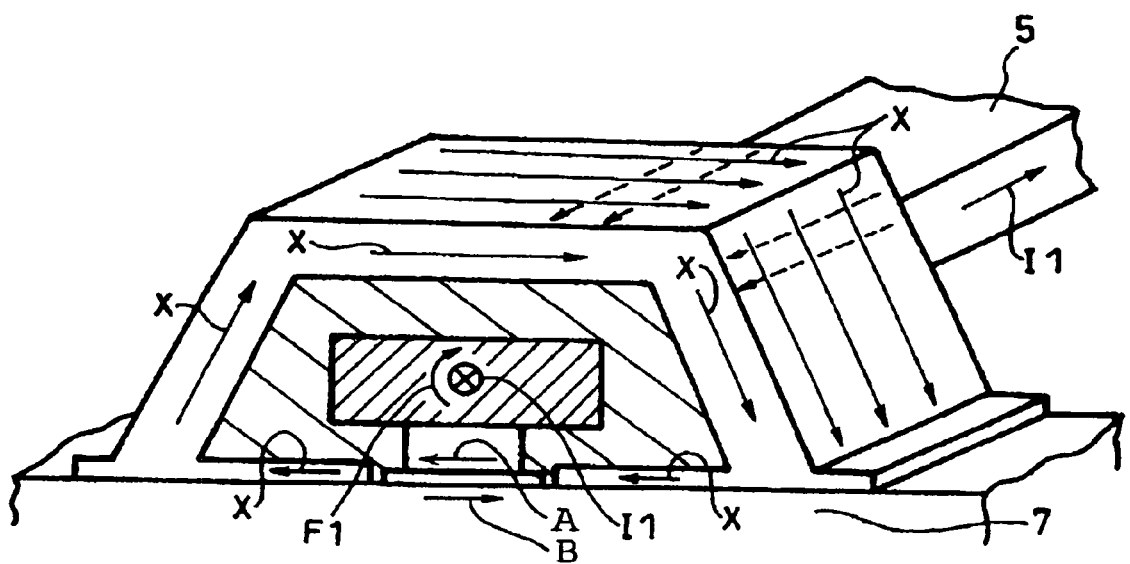
FIG. 8 is a partial cross-sectional perspective view schematically illustrating magnetization of the ferromagnetic yoke structure arranged in the storage area.

As shown in FIG. 8, when a current I1 is passed through the read/write line 5, a circumferential magnetic field F1 is generated about the read/write line 5.

The magnetic field F1 within the ferromagnetic yoke structure 20 forms a closed path about the read/write line 5. The magnetic field F1 thus causes the magnetization X of the ferromagnetic yoke structure 20 to smoothly rotate 90 degrees against the effect of the internal magnetic field to align with the magnetic field F1. The thick distant yoke 20B (in particular the top portion 20T) effectively prevents the leakage of the magnetic field F1 and directs the magnetic field toward the TMR element 4.

As a result, the magnetization X of the ferromagnetic yoke structure 20 and the magnetization F1 generated by the read/write line 5 are added together to form a strong magnetic field, which is focused by the thin close yoke 20A onto the first magnetic layer 4A of the TMR element 4 to cause the direction of magnetization A to switch in the opposite direction. When the current I1 flowing through the read/write line 5 is turned of f at this point, the magnetization A of the first magnetic layer 4A of the TMR element 4 remains reversed as shown in FIG. 8. The magnetizations A and B that are antiparallel to each other represent "1" of a binary data.

Figure 9:
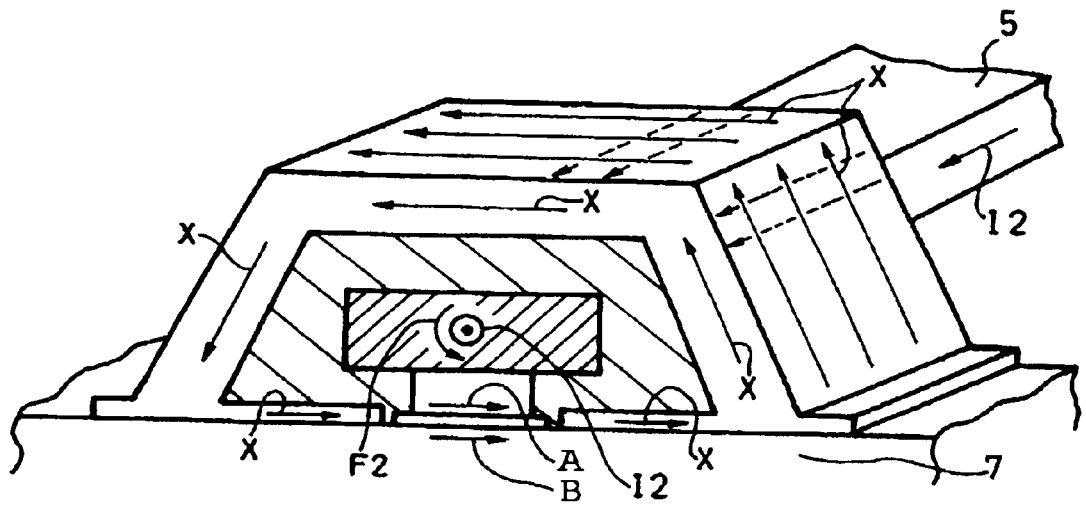
FIG. 9 is a partial cross-sectional perspective view schematically illustrating magnetization of the ferromagnetic yoke structure arranged in the storage area.

Referring now to FIG. 9, when a current I2 is passed through the read/write line 5 in the opposite direction to I1, a circumferential magnetic field F2 is generated about the read/write line 5. The magnetic field F2 within the ferromagnetic yoke structure 20 forms a closed path about the read/write line 5. The magnetic field F2 thus causes the magnetization X of the ferromagnetic yoke structure 20 to smoothly rotate 90 degrees to align with the magnetic field F2.

As a result, the magnetization X of the ferromagnetic yoke structure 20 and the magnetization F2 generated by the read/write line 5 are added together to form a strong magnetic field, which acts upon the first magnetic layer 4A of the TMR element 4 to reverse the magnetization A, so that the magnetization A of the first magnetic layer 4A and the magnetization B of the second magnetization layer 4B are again parallel to each other. The magnetizations A and B that are parallel to each other again represent "0" of a binary data again.

According to this embodiment, the thick distant yoke 20B effectively prevents the magnetic flux from leaking from the opposite side of the TMR element 4. In addition to this, the production cost can be reduced since the slope portions 20S, 20S and the top portion 20T can be formed as an integral film in a single process. The ferromagnetic yoke structure 20 may be formed of a metal material containing at least two of Ni, Fe and Co.

To read binary data from the TMR element 4, a read current is passed between the read/write line 5 and the read line 7 and the potential difference between the two lines is detected. Based on the resistance of the TMR element 4, whether the stored binary data is "0" or "1" can be determined (whether the magnetization A of the first magnetic layer 4A and the magnetization B of the second magnetic layer 4B are parallel or antiparallel can be determined). For example, when the magnetization A of the first magnetic layer 4A and the magnetization B of the second magnetic layer 4B are parallel to each other, the resistance between the first magnetic layer 4A and the second magnetic layer 4B is relatively small because of the tunneling magnetoresistive (TMR) effect of the nonmagnetic insulating layer 4C. Conversely, when the magnetization A and the magnetization B are antiparallel, the TMR effect results in a relatively large resistance between the first magnetic layer 4A and the second magnetic layer 4B.

Next, the effect of external magnetic fields generated by factors other than the write currents I1 and I2 flowing through the read/write line 5 is described.

In an array of the storage areas 3 as shown in FIG. 1, the magnetic field for writing data in a given TMR element 4 affects adjacent TMR elements 4. The effect is particularly significant when the storage areas 3 are highly integrated and arranged close to one another.

Figure 10:
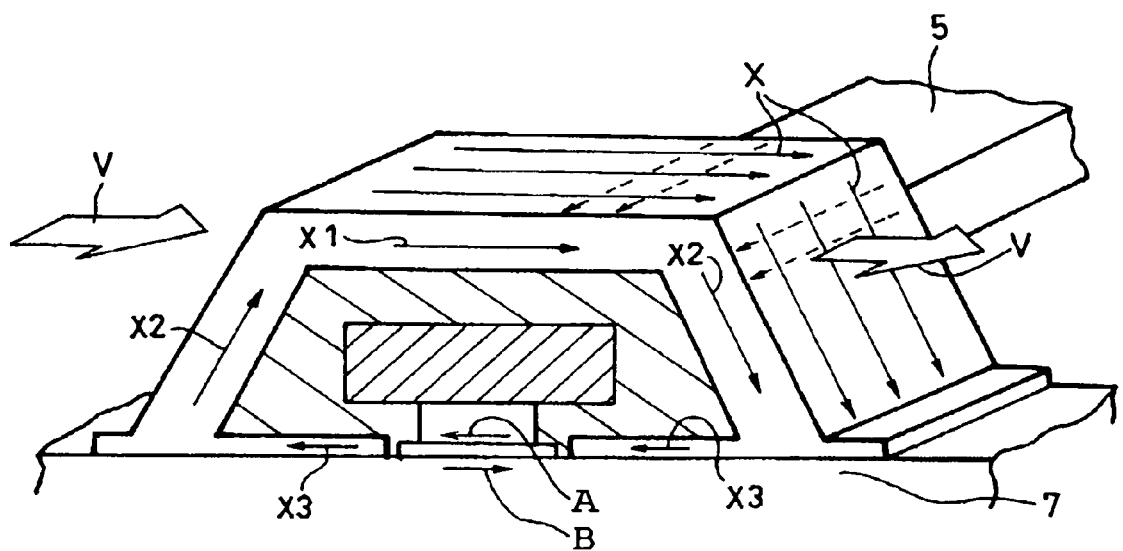
FIG. 10 is a partial cross-sectional perspective view illustrating the magnetic shield effect of the ferromagnetic yoke structure against external magnetic fields.

As shown in FIG. 10, when an external magnetic field V parallel to the write direction (along the easy-magnetization axis) of the TMR element 4 is applied to the element, the magnetic field V directly acts on the first magnetic layer 4A of the TMR element 4 to switch the magnetization A. The magnetic field V also acts on the ferromagnetic yoke structure 20 to rotate the internal magnetic field X1 of the top portion 20T of the distant yoke 20B so that the magnetic field X1 aligns with the external magnetic field V. Since the slope portions 20S, 20S are arranged at an obtuse angle to the top portion 20T, the direction of the internal magnetic field X2 of the slope portions 20S, 20S is also changed to align with the internal magnetic field X1 of the top portion 20T. Thus, the top portion 20T and the slope portions 20S, 20S of the distant yoke 20B together generate a circumferential internal magnetic field (X1, X2) aligned with the external magnetic field V. The circumferential internal magnetic field is directed to the close yoke 20A via the yoke joints 20C, 20C. As a result, an internal magnetic field X3 opposite to the internal magnetic fields X1 and X2 of the distant yoke 20B is generated in the close yoke 20A. The close yoke 20A applies the internal magnetic field X3 to the TMR element 4.

As the external magnetic field V directly acts on the TMR element 4 to write, the ferromagnetic yoke structure 20 produces the internal magnetic field X3 opposite to the external magnetic field V within the close yoke 20A. The magnetic field X3 acts to cancel the external magnetic field V. As a result, the writing errors occurring at the TMR element 4 can be reduced.

In this embodiment, the maximum height H of the distant yoke 20B is within a predetermined range, so that the external magnetic field V in the vicinity of the TMR element 4 can be accurately received. By arranging the TMR element 4 in the gap 20E of the ferromagnetic yoke structure 20, the distance between the distant yoke 208 and the TMR element 4 can further be reduced.

In this embodiment, the close yoke 20A is less susceptible to the external magnetic field V since the thickness TZ of the top portion 20T of the distant yoke 20B is relatively large and the thickness BZ of the close yoke 20A is relatively small. Accordingly, the internal magnetic field of the ferromagnetic yoke structure 20 is substantially governed by the internal magnetic fields X1, X2 of the distant yoke 20B (consisting of the top portion 20T and the slope portions 20S, 20S).

While the line 5 in the described construction is electrically connected to the TMR element 4 via the metal layer 19, the line 5 may be insulated from the TMR element 4 so that it functions only as a write line and, instead, a metal thin film line may be formed on one surface of the TMR element 4 to pass the read current. The space between the ferromagnetic yoke structure 20 and the read/write line 5 arranged within the ferromagnetic yoke structure 20 is filled with an insulator 22, as is the space between the close yoke 20A and the TMR element 4. This prevents contact and short-circuiting between these elements.

Characteristics of the magnetic memory 1 are now described.

The magnetic memory 1 of this embodiment is configured such that, given that $H_c$ is the coercivity of the TMR element 4, $H_{ext}$ is the magnetic field of the external magnetic field V and $|H_{ext}/H_c|$ is the normalized external magnetic field and has a value close to 1 (this condition may be adopted in a real system), the magnetization X of the TMR element 4 will not be reversed spontaneously by the external magnetic field $H_{ext}$. In this embodiment, the magnetic memory is configured such that the magnetization X of the TMR element 4 is not reversed by an external magnetic field V equivalent to the coercivity of the TMR element 4 (80(Oe)). This construction ensures that the storage areas 3 are individually shielded from the external magnetic field.

The magnetic memory 1 of this embodiment is also configured such that, given that $I_{sw}[H_0]$ is the current required to flow through the read/write line 5 to write in the TMR element 4 in the absence of the external magnetic field, $I_{sw}[H_{ext}]$ is the current required to write in the TMR element 4 in the presence of the external magnetic field, and $|I_{sw}[H_{ext}]/I[H_0]|$ is the normalized write current, the rate of change in the normalized write current $|I_{sw}[H_{ext}]/I_{sw}[H_0]|$ is in the range of greater than −1 and less than 0 when the normalized external magnetic field $|H_{ext}/H_c|$ is increased. This construction ensures that the reduction in the required write current $I_{sw}[H_{ext}]$ is small relative to the increase in the magnetic field $H_{ext}$ of the external magnetic field V, so that the write operation based on the current flowing through the read/write line 5 is not significantly affected by the effect of the external magnetic field V.

Figure 11:
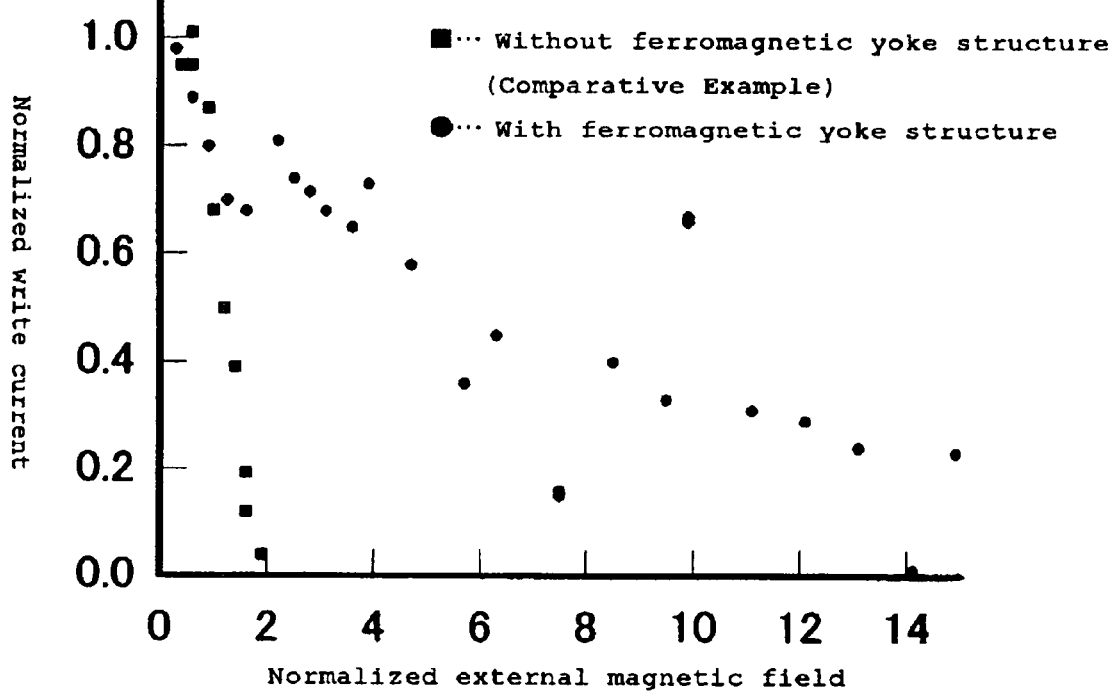
FIG. 11 contains graphs showing the changes in the normalized write current for the magnetic memory with respect to the normalized external magnetic field.
Figure 11:
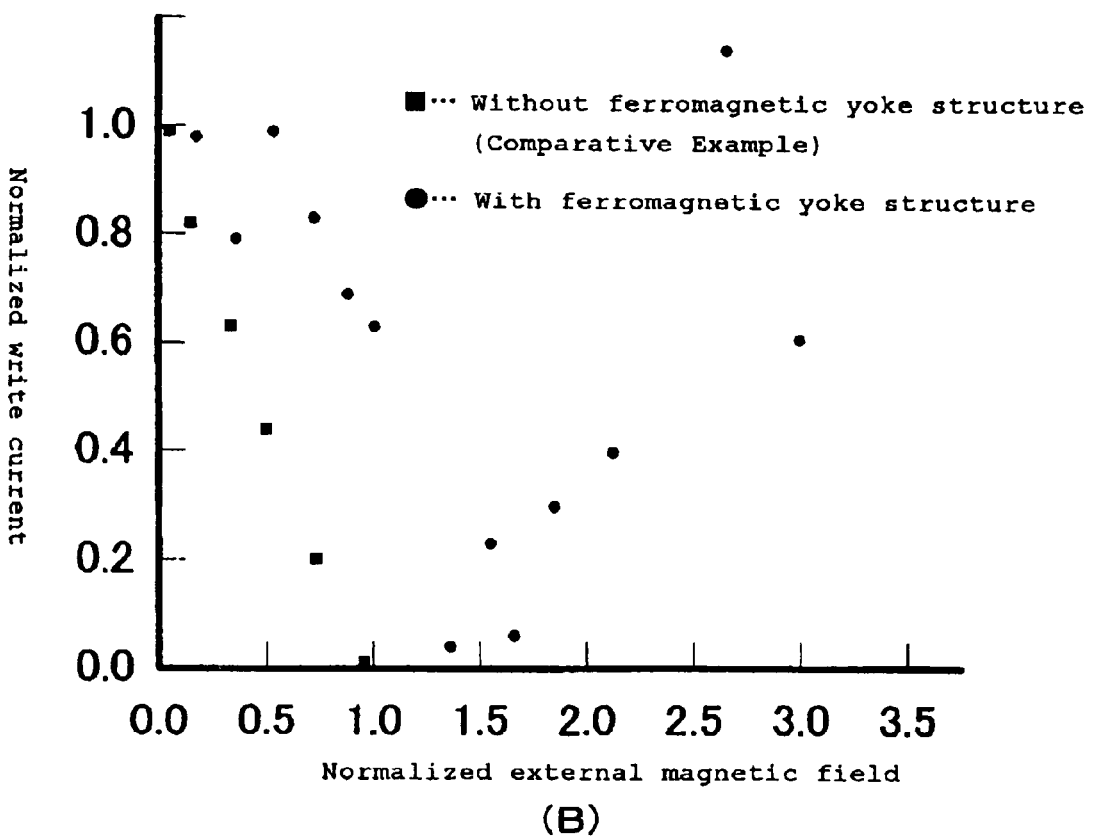

FIG. 11(A) shows changes in the normalized write current $|I_{sw}[H_{ext}]/I_{sw}[H_0]|$ with respect to the normalized external magnetic field $|H_{ext}/H_c|$ when an external magnetic field V parallel to the read/write line 5 (or perpendicular to the easy-magnetization axis of the TMR element 4) is applied to the magnetic memory 1 of the this embodiment. For comparison, changes observed when the ferromagnetic yoke structure 20 is omitted are shown together.

As can be seen from the figure, the rate of change observed in the absence of the ferromagnetic yoke structure 20 is approximately −0.5, whereas the rate of change observed for the magnetic memory 1 of this embodiment featuring the ferromagnetic yoke structure 20 is approximately −0.1, a significantly greater value than −0.5. This indicates that the effect of the external magnetic field V on the write current in the magnetic memory 1 of this embodiment is reduced to about one-fifth the effect observed in conventional magnetic memories.

FIG. 11(B) shows changes in the normalized write current $|I_{sw}[H_{ext}]/I_{sw}[H_0]|$ with respect to the normalized external magnetic field $|H_{ext}/H_c|$ when an external magnetic field V perpendicular to the read/write line 5 (or parallel to the easy-magnetization axis of the first magnetic layer 4A of the TMR element 4) is applied to the magnetic memory 1 of this embodiment. For comparison, changes observed when the ferromagnetic yoke structure 20 is omitted from the magnetic memory 1 are shown together. The rate of change observed in the absence of the ferromagnetic yoke structure 20 is approximately −1.0, whereas the rate of change observed for the magnetic memory 1 of this embodiment featuring the ferromagnetic yoke structure 20 is approximately −0.5, a significantly greater value than −1.0. This indicates that the effect of the external magnetic field V on the write current in the magnetic memory 1 of this embodiment is reduced to about one-half the effect observed in conventional magnetic memories.

Overall, in the magnetic memory 1 of this embodiment featuring a structure to shield external magnetic fields, the reduction in the normalized write current $|I_{sw}[H_{ext}]/I_{sw}[H_0]|$ is minimized even when the normalized external magnetic field $|H_{ext}/H_c|$ is increased. This suggests that the effect of the external magnetic field V on the write current is minimized in the magnetic memory of this embodiment.

Figure 12:
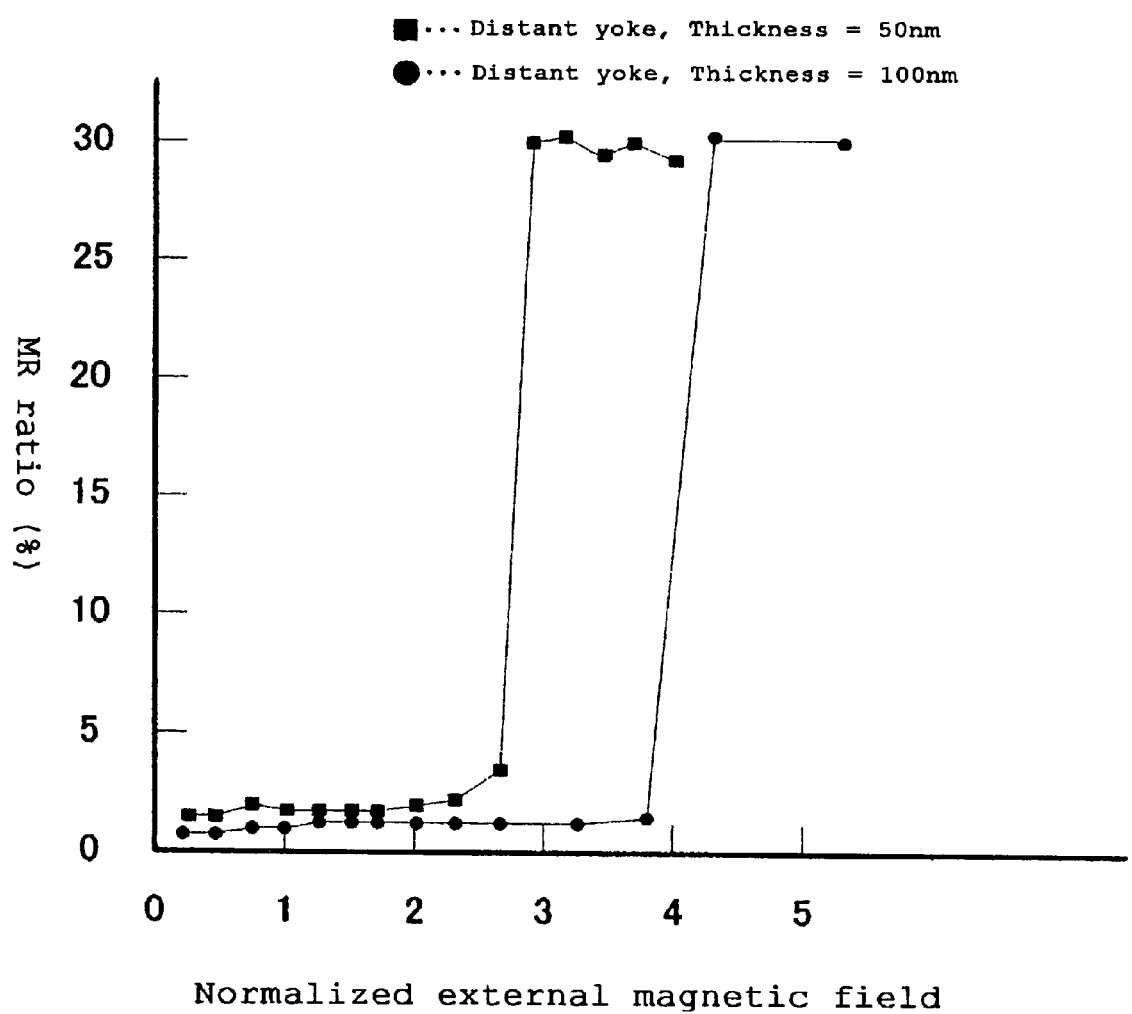
FIG. 12 is a graph showing the changes in the MR ratio for the magnetic memory with respect to the normalized external magnetic field.

FIG. 12 shows the results of an analysis of the changes in the MR ratio for the TMR element 4 of the magnetic memory 1 of this embodiment with respect to the normalized external magnetic field $|H_{ext}/H_c|$. In this analysis, two different magnetic memories 1 having distant yokes 20B with different thicknesses of 50 nm and 100 nm are used and an external magnetic field V parallel to the magnetization of the TMR element 4 (or parallel to the easy-magnetization axis) is applied to each magnetic memory. The term "MR ratio" is defined as follows: $\{R(a\square b)-R(a=b)\}/R(a=b)$, where $R(a=b)$ is the resistance of the TMR element 4 when the magnetization A of the first magnetic layer 4A and the magnetization B of the second magnetic layer 4B are parallel and $R(a\square b)$ is the resistance of the TMR element 4 when the magnetization A of the first magnetic layer 4A and the magnetization B of the second magnetic layer 4B are antiparallel.

As can be seen from the figure, the magnetic memory 1 in which the distant yoke 20B has a thickness of 50 nm shows stable MR ratio when the normalized external magnetic field $|H_{ext}/H_c|$ is 2 or less, or the magnetic field $H_{ext}$ of the external magnetic field V is less than or equal to twice the coercivity Hc of the TMR element 4. In other words, the read performance of the TMR element 4 in this magnetic memory remains stable until the magnetic field $H_{ext}$ of the external magnetic field V reaches twice the coercivity Hc of the TMR element 4.

In comparison, the magnetic memory 1 in which the distant yoke 20B has a thickness of 100 nm shows stable MR ratio when the normalized external magnetic field $|H_{ext}/H_c|$ is 3 or less, or the magnetic field $H_{ext}$ of the external magnetic field V is less than or equal to three times the coercivity Hc of the TMR element 4. In other words, the read performance of the TMR element 4 in this magnetic memory remains stable until the magnetic field $H_{ext}$ of the external magnetic field v reaches three times, in particular about four times, the coercivity Hc of the TMR element 4.

These results suggest that the ferromagnetic yoke structure 20 of the magnetic memory 1 of this embodiment also serves to stabilize the performance of the TMR element 4. In particular, the ferromagnetic yoke structure 20 having a thicker distant yoke 20B can provide a higher shielding effect against the external magnetic field V and thus can more effectively stabilize the read performance of the TMR element 4. The reason for the stabilization of the performance of TMR element 4 is believed to be that when the external magnetic field V is applied, the ferromagnetic yoke structure 20 produces an opposite internal magnetic field in the close yoke 20A, which cancels the effect of external magnetic field V.

Figure 13:
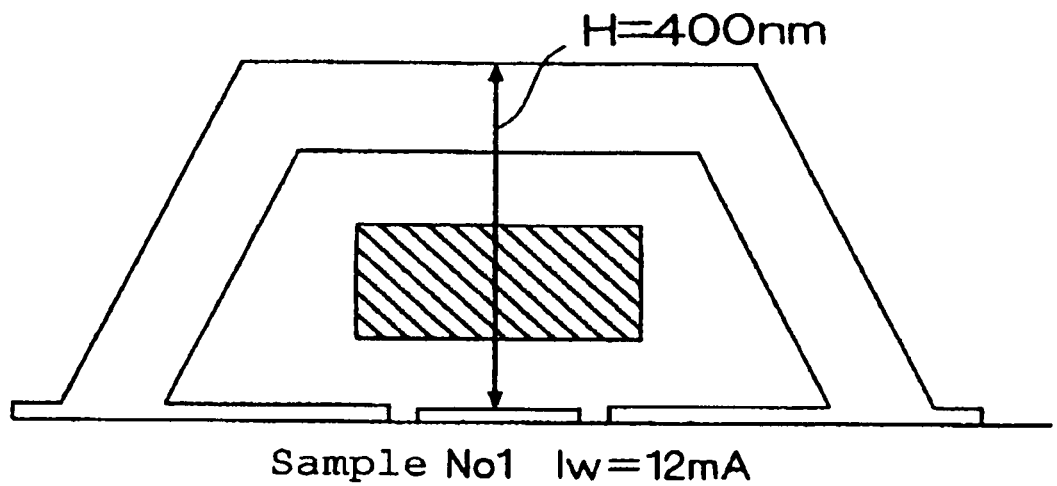
FIG. 13 contains cross-sectional views of different ferromagnetic yoke structures in which yokes distant from the magnetoresistive element are arranged at different heights. The figure illustrates how the current changes as a function of the height of the yoke structure.
Figure 13:
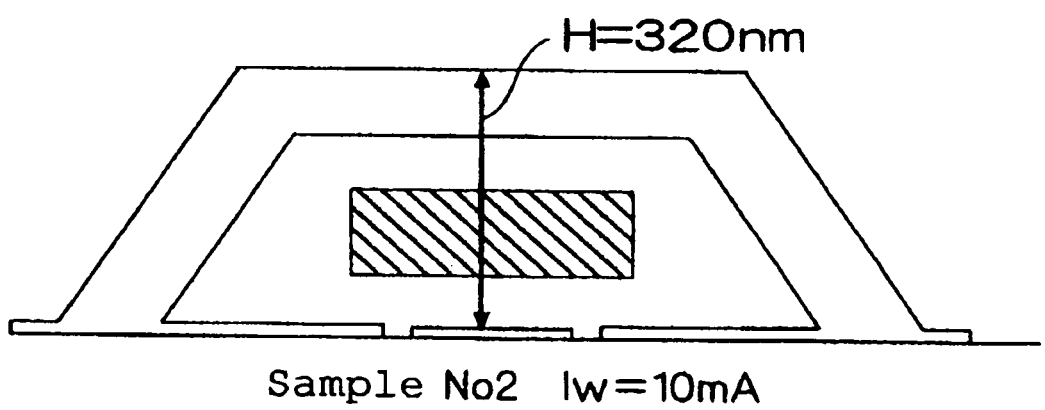
Figure 13:
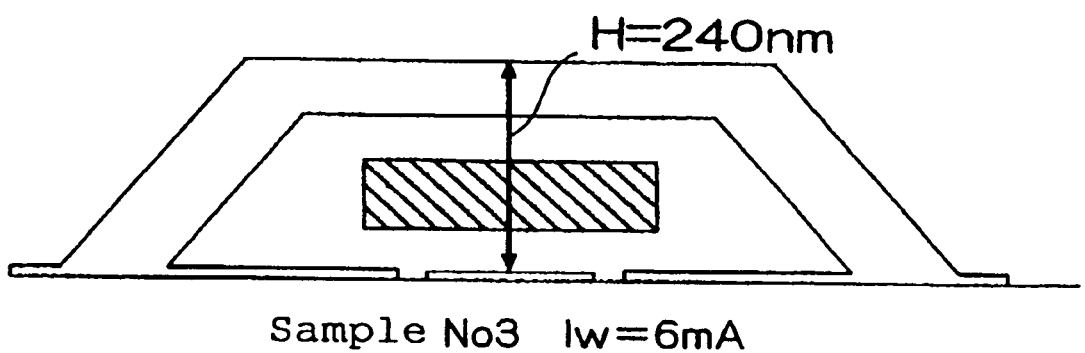

FIG. 13 shows a comparison of write current Iw (mA) in three ferromagnetic yoke structures 20 in which the maximum height of the distant yoke 20B is changed (Sample No. 1=400 nm, Sample No. 2=320 nm and Sample No. 3=240 nm).

It turned out that the write current was 12 mA for the ferromagnetic yoke structure 20 of Sample No. 1 in which the maximum height of the distant yoke 20B was 400 nm. The write current was 10 mA for the ferromagnetic yoke structure 20 of Sample No. 2 in which the maximum height of the distant yoke 20B was 320 nm. The write current was 6 mA for the ferromagnetic yoke structure 20 of Sample No. 3 in which the maximum height of the distant yoke 20B was 240 nm. In other words, the magnetization of the TMR element 4 can be reversed by a smaller current Iw in a magnetic memory having a lower profile distant yoke 20B. This indicates that the sensitivity of the ferromagnetic yoke structure 20 to a magnetic field increases as the distance between the distant yoke 20B and the TMR element 4 is decreased. This is also the case when the magnetic field is external magnetic field V: A ferromagnetic yoke structure 20 with a lower distant yoke 20B (i.e., the distance between the TMR element 4 and the distant yoke 20B is relatively small) can more effectively incorporate external magnetic field V and can produce a stronger internal magnetic field opposite to the external magnetic field V in the TMR element 4.

Since the magnetic memory 1 of this embodiment having a structure for shielding external magnetic fields is configured such that the magnetization X of the TMR element 4 is not spontaneously reversed by an external magnetic field $H_{ext}$ when the normalized external magnetic field $|H_{ext}/H_c|$ is 1, the writing errors in the storage areas 3 are individually reduced. In particular, since the rate of change in the normalized write current $|I_{sw}[H_{ext}]/I_{sw}[H_0]|$ in the magnetic memory of the present invention is such that it remains within the range of greater than −1 and less than 0 when the normalized external magnetic field $|H_{ext}/H_c|$ is increased, the reduction in the required write current $I_{sw}[H_{ext}]$ is small relative to the increase in the magnetic field $H_{ext}$ of the external magnetic field V. As a result, the write operation based on the current flowing through the read/write line 5 is not significantly affected by the effect of the external magnetic field V.

The generally circular ferromagnetic yoke structure 20 for shielding external magnetic fields can take advantage of the external magnetic field V to produce a magnetic field opposite to the external magnetic field V in the TMR element 4. As a result, the external magnetic field V is canceled out, so that writing errors occurring at each TMR element 4 can be reduced. Furthermore, the ferromagnetic yoke structure 20 accommodating the read/write line 5 prevents the write magnetic field generated by the read/write line 5 from leaking outside the ferromagnetic yoke structure 20. Thus, not only is the effect of the external magnetic field V on the writing operation decreased, but the effective use of the write magnetic field is also achieved.

In this embodiment, a gap 20E is formed in the close yoke 20A to receive the TMR element 4. In such a construction, an internal magnetic field opposite to the external magnetic field V can be directly applied to the TMR element 4 from the open end of the close yoke 20A. This facilitates canceling of the external magnetic field V. By arranging the TMR element 4 in the gap 20E, the distant yoke 20B can be arranged close to the TMR element 4, so that the external magnetic field V can be properly shielded in the vicinity of the TMR element 4.

The distant yoke 20B in this embodiment is thicker than the close yoke 20A. In such a construction, an internal magnetic field parallel to the external magnetic field V is effectively produced in the top portion 20T and the slope portions 20S, 20S. This internal magnetic field can be reversed in the close yoke 20A and applied to the TMR element 4. In addition, the gentle slope of the slope portions 20S, 20S keeps the magnetic fields in the slope portions 20S, 20S and the top portion 20T from canceling each other. This facilitates the generation of internal magnetic fields in the same direction.

In the production of the magnetic memory 1 of this embodiment, the top portion 20T and the slope portions 20S, 20S can be formed at the same time as the insulator-covered read/write line 5. In this manner, the maximum height of the top portion 20T of the distant yoke 20B can be decreased as compared to formation of "upright" slope portions 20S, 20S, which must be formed separately. As a result, the shielding effect of the distant yoke 20B against the external magnetic field V can be increased.

Figure 14:
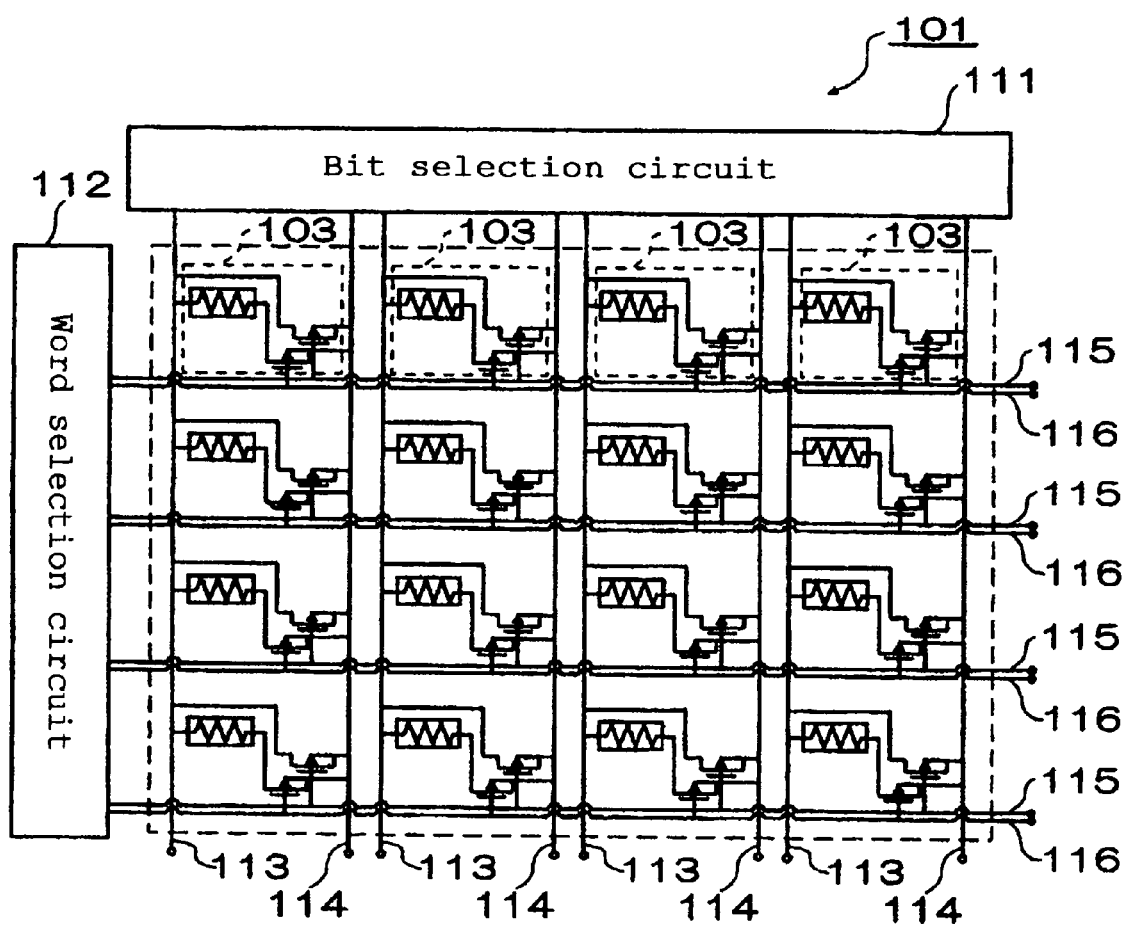
FIG. 14 is a schematic view showing the overall arrangement of a magnetic memory according to a second embodiment of the present invention.

Referring now to FIG. 14, the overall arrangement of a magnetic memory 101 according to a second embodiment of the present invention is shown. The magnetic memory 101 is primarily described with regard to its differences from the first embodiment. The components and elements common to the first embodiment are designated by reference numerals having the same last two digits and will not be described again.

Figure 15:
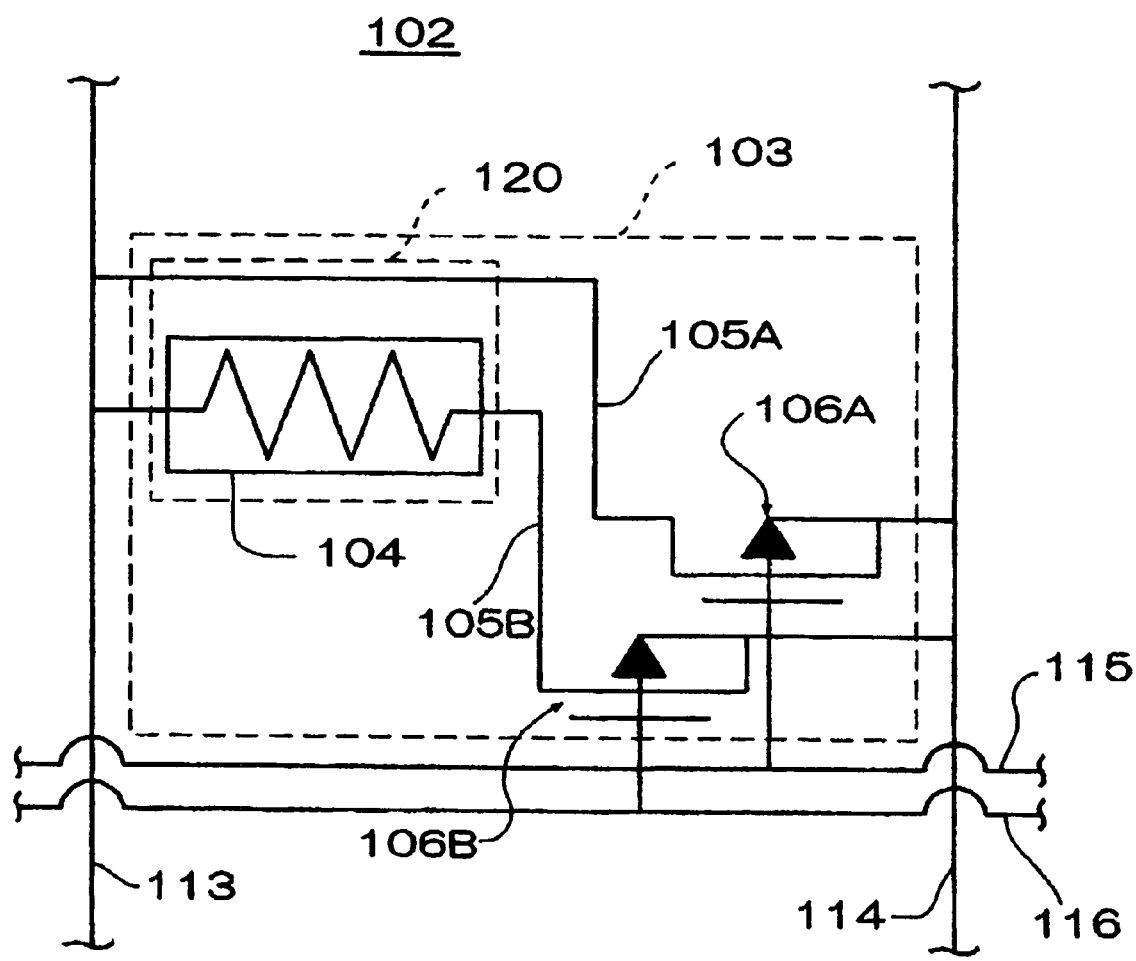
FIG. 15 is a schematic enlarged view of a storage area of the magnetic memory.

As shown in FIG. 15 in an enlarged view, each storage area 103 in a storage unit 102 of the magnetic memory 101 includes a TMR element 104, a read/write line 105A, a read-only line 105B, a write-only transistor 106A and a read-only transistor 106B. Unlike the first embodiment that uses a read/write line, the magnetic memory 101 of the second embodiment has the write-only line 105A and the read-only line 105B that are arranged separately. Such a construction helps reduce the sneak current and other noise factors.

The ends of the write-only line 105A are connected to two bit lines 113, 114. Arranged on the write-only line 105A is the write transistor 106A. Thus, a current flows through the write-only line 105A when a voltage is applied between the bit lines 113, 114 to turn on the write-only transistor 106A. This results in the generation of a magnetic field around the adjacent TMR element 104. Likewise, the ends of the read-only line 105B are connected to the two bit lines 113, 114. Arranged on the read-only line 105B are the read-only transistor 106B and the TMR element 104. Thus, a current flows through the read-only line 105B when a voltage is applied between the bit lines 113, 114 to turn on the read-only transistor 106B. This enables the detection of the resistance of the TMR element 104. The write-only transistor 106A and the read-only transistor 106B are connected to the word line 115 and the word line 116, respectively. Thus, transistors 106A, 106B can be individually turned on or turned off by voltages applied to the word lines 115, 116. In this manner, a current may be passed from the bit lines 113, 114 to the word line 115 as desired.

Figure 16:
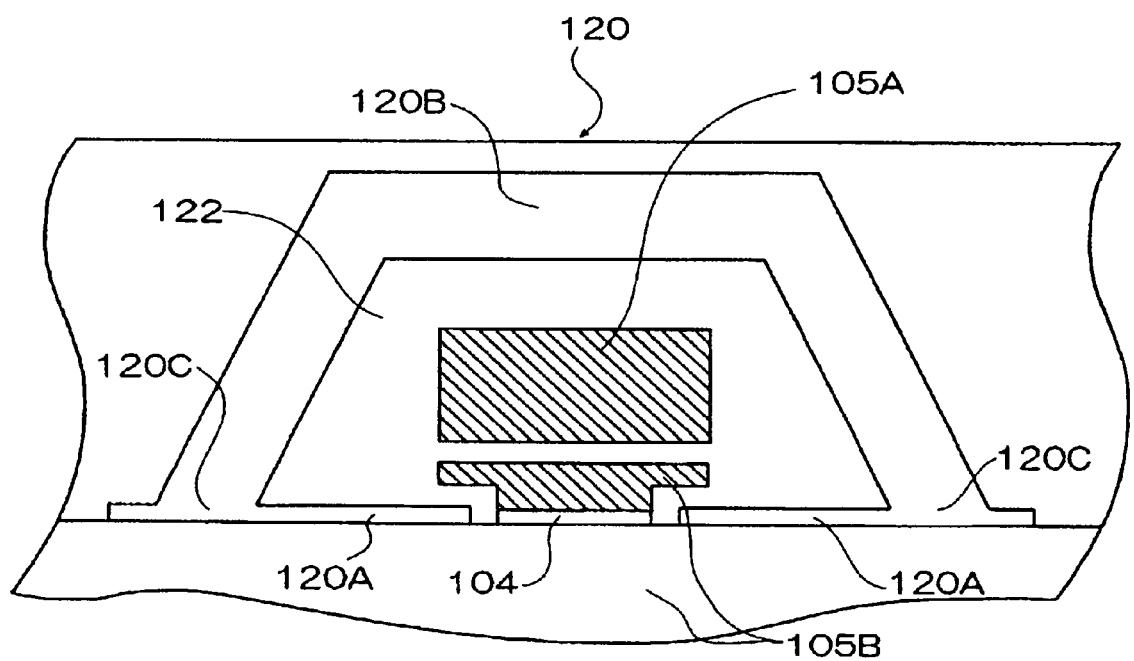
FIG. 16 is an enlarged cross-sectional view showing the internal structure of the storage area.

With reference to FIG. 16, a ferromagnetic yoke structure 120 is shown in an enlarged view. The ferromagnetic yoke structure 120, serving as a structure to shield external magnetic fields, is configured to include a yoke 120A (close yoke) adjacent to the side of the write-only line 105A facing the TMR element 104, a yoke 120B (distant yoke) adjacent to the side of the write-only line 105A opposite to the TMR element 104, and a pair of yoke joints 120C, 120C to join the ends of the close yoke 120A to the respective ends of the distant yoke 120B to form a generally circular construction. The close yoke 120A has a gap in which the TMR element 104 is arranged.

The TMR element 104 is insulated from the write-only line 105A by an insulator 122. The upper surface and the lower surface of the TMR element 104 are connected to the read-only line 105B. The read-only line 105B connected to the upper surface of the TMR element 104 is generally configured as a thin film having a cross-section projecting downward, so that the distance between the write-only line 105A and the TMR element 104 can be minimized. The precise dimensions of the ferromagnetic yoke structure 120 are the same as the first embodiment.

As in the first embodiment, the ferromagnetic yoke structure 120 in the magnetic memory 101 of the second embodiment also serves to shield the external magnetic field V. In addition, since the write-only line 105A and the read-only line 105B are separately arranged, a current can be passed only through the write-only line 105A during writing, or only through the read-only line 105B during reading. As a result, sneak currents can be avoided without providing diodes and the read and write operations can be further stabilized.

Although the magnetic memory of the present invention has been described with reference to the first and the second embodiments, these embodiments are presented by way of example only and other variations are possible. For example, the TMR element used as a magnetoresistive element in the foregoing embodiments may be replaced with a GMR element utilizing giant magnetoresistive (GMR) effect. The GMR effect is a phenomenon observed in two ferromagnetic layers sandwiching a non-magnetic layer. Specifically, the resistance of the ferromagnetic layers in the direction perpendicular to the layers changes depending on the angle between the magnetizations of the two ferromagnetic layers. In a typical GMR element, the resistance of the ferromagnetic layers is minimum when the magnetizations of the two ferromagnetic layers are parallel to each other and the resistance of the ferromagnetic layers is maximum when the magnetizations of the two ferromagnetic layers are antiparallel. There are two types of TMR elements and GMR elements: Quasi-spin valve type and spin valve type. In quasi-spin valve TMR or GMR elements, write/read operations are carried out based on the difference in the coercivity of the two ferromagnetic layers. In spin valve TMR or GMR elements, the magnetization of one of the two ferromagnetic is fixed by exchange coupling to an antiferromagnetic layer. To read data from a GMR element, the change in the resistance of the ferromagnetic layer perpendicular to the layers is detected. To write date in a GMR element, the magnetization of one of the two ferromagnetic layers is switched by a magnetic field produced by the write current.

While transistors (read/write transistors) are used as switches to control the write and read currents in the foregoing embodiments, other means that can turn on or off a current may also be used as switches.

As used herein, the phrase "a gap formed in the close yoke" concerns the final conformation of the ferromagnetic yoke structure 20 and does not necessarily mean that the gap is formed by cutting a single continuous close yoke 20A in halves. For example, a pair of close yokes 20A may be separately arranged (which are seemingly the same as the cut halves) so that the TMR element 4 can be arranged in between.

It should be appreciated that the foregoing embodiments of the magnetic memory of the present invention are illustrative rather than exhaustive and various modifications and changes may be made without departing from the sprit and scope of the invention.

The present invention finds wide applications in various fields where data is stored in magnetoresistive elements.

The entire disclosure of Japanese Patent Application No. 2006-34938 filed on Feb. 13, 2006 including specification, claims, drawings, and summary are incorporated herein by reference in its entirety.

What is claimed is:

1. A magnetic memory comprising:
a conductor line;
a magnetoresistive element arranged adjacent to a part of the line; and
a shield structure for shielding the magnetoresistive element against external magnetic field caused by factors other than the part of the line and wherein, given that $H_c$ is the coercivity of the magnetoresistive element, $H_{ext}$ is the external magnetic field and $|H_{ext}/H_c|$ is the normalized external magnetic field and has a value close to 1, the magnetization of the magnetoresistive element is configured such that it is not reversed by the external magnetic field $H_{ext}$.

2. The magnetic memory according to claim 1, wherein a gap is formed in a ferromagnetic yoke structure along its circumference with the magnetoresistive element being arranged in the gap.

3. The magnetic memory according to claim 1, wherein, given that $I_{sw}[H_0]$ is a current required to flow through the line to write in the magnetoresistive element in the absence of the external magnetic field, $I_{sw}[H_{ext}]$ is a current required to flow through the line to write in the magnetoresistive element in the presence of the external magnetic field, and $|I_{sw}[H_{ext}]/I_{sw}[H_0]|$ is the normalized write current, the rate of change in the normalized write current $|I_{sw}[H_{ext}]/I_{sw}[H_0]|$ is in the range of greater than −1 and less than 0 when the normalized external magnetic field $|H_{ext}/H_c|$ is increased.

4. The magnetic memory according to claim 1, wherein,
the shield structure is a substantially circular ferromagnetic yoke structure; and
the magnetoresistive element is arranged adjacent to a part of the ferromagnetic yoke structure.

5. The magnetic memory according to claim 1, wherein,
a ferromagnetic yoke structure encircles a part of the line.

6. A magnetic memory comprising:
a conductor line;
a magnetoresistive element arranged adjacent to a part of the line; and
a shield structure for shielding the magnetoresistive element against external magnetic field caused by factors other than the part of the line and wherein, given that $H_c$ is the coercivity of the magnetoresistive element, $H_{ext}$ is the external magnetic field, $|H_{ext}/H_c|$ is the normalized external magnetic field, $I_{sw}[H_0]$ is a current required to flow through the line to write in the magnetoresistive element in the absence of the external magnetic field, $I_{sw}[H_{ext}]$ is a current required to flow through the line to write in the magnetoresistive element in the presence of the external magnetic field, and $|I_{sw}[H_{ext}]/I_{sw}[H_0]|$ is the normalized write current, the rate of change in the normalized write current $|I_{sw}[H_{ext}]/I_{sw}[H_0]|$ is in the range of greater than −1 and less than 0 when the normalized external magnetic field $|H_{ext}/H_c|$ is increased.

7. The magnetic memory according to claim 6, wherein a gap is formed in the ferromagnetic yoke structure along its circumference with the magnetoresistive element being arranged in the gap.

8. A magnetic memory comprising:
a conductor line;
a magnetoresistive element arranged adjacent to a part of the line; and
a shield structure for shielding the magnetoresistive element against external magnetic field caused by factors other than the part of the line;
a first yoke arranged adjacent to the magnetoresistive element;
a second yoke arranged at a distance from the surface of the magnetoresistive element; and
a yoke joint that joins the first yoke to the second yoke and produces in the first yoke an internal magnetic field opposite to an internal magnetic field of the second yoke and wherein the second yoke has a greater thickness than the first yoke.

9. The magnetic memory according to claim 8, wherein a part of the second yoke adjacent to the yoke joint is sloped toward the first yoke.

10. The magnetic memory according to claim 8, wherein a maximum height of the second yoke with respect a surface of the magnetoresistive element is small as compared to a maximum length of the magnetoresistive element along the surface of the element; and
the second yoke has a greater thickness than the first yoke.

11. The magnetic memory according to claim 8, wherein a maximum height of the second yoke with respect a surface of the magnetoresistive element is small as compared to a maximum length of the magnetoresistive element along the surface of the element; and
    a part of the second yoke adjacent to the yoke joint is sloped toward the first yoke.

12. The magnetic memory according to claim 8, wherein the second yoke has a greater thickness than the first yoke; and
    a part of the second yoke adjacent to the yoke joint is sloped toward the first yoke.

13. A magnetic memory comprising:
a conductor line; and
a magnetoresistive element arranged adjacent to a part of the line, wherein
given that $H_c$ is the coercivity of the magnetoresistive element, $H_{ext}$ is an external magnetic field generated by factors other than the part of the line, $|H_{ext}/H_c|$ is the normalized external magnetic field, $I_{sw}[H_0]$ is a current required to flow through the line to write in the magnetoresistive element in the absence of the external magnetic field, $I_{sw}[H_{ext}]$ is a current required to flow through the line to write in the magnetoresistive element in the presence of the external magnetic field, and $|I_{sw}[H_{ext}]/I_{sw}[H_0]|$ is the normalized write current, the rate of change in the normalized write current $|I_{sw}[H_{ext}]/I_{sw}[H_0]|$ is in the range of greater than $-0.5$ and less than $0$ when the normalized external magnetic field $|H_{ext}/H_c|$ is increased.

14. The magnetic memory according to claim 13, further comprising a yoke arranged at a distance from a surface of the magnetoresistive element and having a thickness of 50 nm or more.

* * * * *